United States Patent [19]

Fujiyama

[11] Patent Number: 4,648,348
[45] Date of Patent: Mar. 10, 1987

[54] PLASMA CVD APPARATUS

[75] Inventor: Yasutomo Fujiyama, Tokyo, Japan

[73] Assignee: Canon Kabushiki Kaisha, Tokyo, Japan

[21] Appl. No.: 758,118

[22] Filed: Jul. 23, 1985

[30] Foreign Application Priority Data

Jul. 31, 1984 [JP] Japan ................................. 59-160335

[51] Int. Cl.⁴ ............................................. C23C 13/08
[52] U.S. Cl. .................................. 118/723; 118/719; 118/50.1
[58] Field of Search .......................... 430/128; 427/39; 118/723, 50.1, 719; 156/345

[56] References Cited

U.S. PATENT DOCUMENTS 4,292,153  9/1981  Kudo et al. ..................... 427/38 X
4,298,443 11/1981  Maydan .......................... 204/298 X
4,466,380  8/1984  Jansen et al. ................... 118/725 X Primary Examiner—Richard Bueker
Attorney, Agent, or Firm—Fitzpatrick, Cella, Harper & Scinto

[57] ABSTRACT

There is disclosed a plasma CVD apparatus for depositing a film on a substrate by creating a discharge between the substrate and an electrode arranged to face the substrate, wherein the electrode is constructed by a plurality of hexagonal pillar electrodes arranged in a honeycomb structure.

2 Claims, 2 Drawing Figures

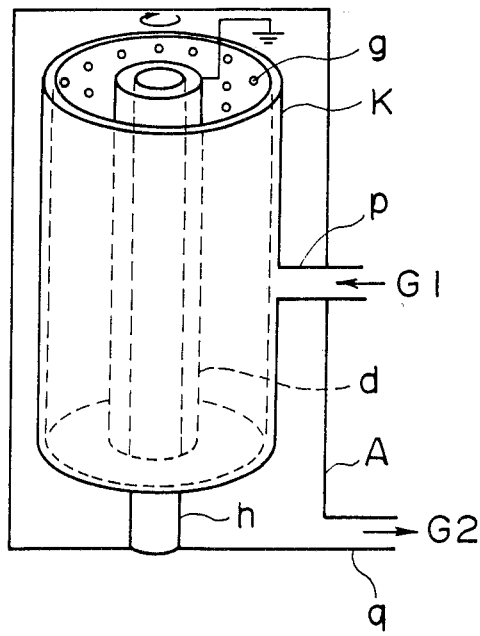
F I G. 1
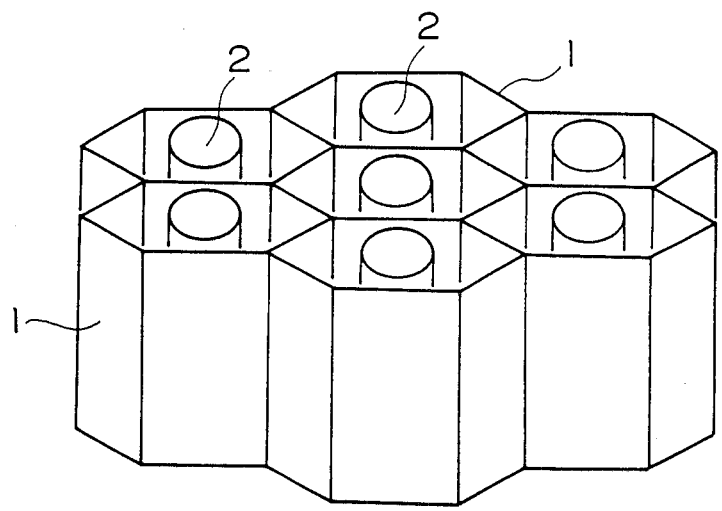
F I G. 2

PLASMA CVD APPARATUS

BACKGROUND OF THE INVENTION

1. Field of the Invention

The present invention relates to an improved plasma CVD apparatus.

2. Description of the Prior Art

A plasma CVD apparatus can vapor-deposit an amorphous silicon film on a surface of an electrophotographic photoconductor drum.

FIG. 1 shows a schematic view of such a plasma CVD apparatus. In FIG. 1, A denotes a reactor, K denotes a cylindrical cathode electrode arranged in the reactor A, d denotes an anode electrode drum coaxially arranged in the cathode electrode K, and h denotes a heater arranged in the drum d. The drum d is rotated in a direction of an arrow by drive means, not shown. The cathode electrode K has a dual wall structure. A reaction gas supplied from a gas supply source (not shown) through a gas introduction port p is supplied into the dual wall structure and the reaction gas is discharged from a gas discharge port g formed in an inner wall of the dual wall structure toward the cathode electrode K. An RF power from a power supply (not shown) is supplied to the cathode electrode K. Thus, a plasma discharge is created between the cathode electrode K and the anode electrode drum d and an amorphous silicon film is formed on the surface of the drum d. The gas contributed to the reaction is taken out of a gas exhaust port q formed in the reactor A.

In such a plasma CVD apparatus having the coaxial cylindrical electrode structure, when a number of photoconductor drums are to be manufactured, a plurality of pairs of the cathode and anode electrode structures must be arranged in the reactor. However, since each pair of electrodes is of cylindrical electrode structure, much wasteful space is formed between the structures if a plurality of such structures are arranged. As a result, the number of drums accommodated per unit reactor area is lowered and a manufacturing efficiency is lowered.

SUMMARY OF THE INVENTION

It is an object of the present invention to provide a plasma CVD apparatus having a high manufacturing efficiency.

It is another object of the present invention to provide a plasma CVD apparatus which forms a deposition film on a substrate by creating a discharge between the substrate and an electrode arranged to face the substrate, and in which the electrode is constructed by a plurality of hexagonal pillar electrodes arranged in a honeycomb structure.

BRIEF DESCRIPTION OF THE DRAWINGS

FIG. 1 shows a prior art plasma CVD apparatus having a coaxial cylindrical electrode structure, and FIG. 2 is a perspective view of a main portion of a plasma CVD apparatus of the present invention.

DETAILED DESCRIPTION OF THE PREFERRED EMBODIMENT

FIG. 2 is a perspective view of a major portion of a plasma CVD apparatus of the present invention. Numeral 1 denotes first electrodes each having a hexagonal pillar shape, which are arranged to form a honeycomb structure, and numeral 2 denotes second cylindrical electrodes each coaxially arranged in the first electrode 1. The first electrodes 1 and the second electrodes 2 are accommodated in a reactor, not shown.

A reaction gas may be jetted from a ceiling of the reactor toward a port at the top of the first electrode 1, and the reacted gas may be exhausted from the bottom wall of the reactor. The first electrode 1 may be of dual wall structure, a plurality of holes for discharging gas may be formed in an inner wall of the dual wall structure, the reaction gas supplied to the dual wall structure from the exterior of the outer all of the first electrode through gas introduction means such as a pipe may be supplied into the first electrode through the gas discharge holes, and the reacted gas may be exhausted from the openings at the top and the bottom of the first electrode.

When the second electrode 2 is to be used as the electrophotographic photoconductor drum, the second electrode 2 is used as an anode electrode which is grounded, and the first electrode is used as the cathode electrode K, and an RF power is supplied thereto from a power source (not shown).

In the present apparatus, an amorphous silicon (a-Si) film, for example, may be formed on a planar substrate. The planar substrate is arranged on the inner wall of the first electrode 1, the first electrode 1 is used as the anode electrode which is grounded, and the second electrode 2 is used as the cathode electrode and the RF power is applied therebetween. In this manner, the a-Si film can be efficiently formed on the planar substrate.

In accordance with the present invention, the number of members to be processed (drums, planar substrates) per unit reactor area is increased by the honeycomb structure of the first electrodes, and the plasma CVD apparatus having excellent film characteristic and a high deposition rate is provided.

What is claimed is:

1. A plasma CVD apparatus for depositing a film on a substrate by creating a discharge between the substrate and an outer electrode arranged to face the surface of the substrate on which the film is deposited wherein said electrode is formed from a plurality of hexagonal pillar electrodes so that said electrode forms a honeycomb structure.

2. A plasma CVD apparatus according to claim 1 wherein said substrate is coaxially arranged in the hexagonal pillar electrode.

* * * * *